United States Patent [19]

Takemi et al.

[11] Patent Number: 5,394,417
[45] Date of Patent: Feb. 28, 1995

[54] SEMICONDUCTOR LASER PRODUCING VISIBLE LIGHT

[75] Inventors: Masayoshi Takemi; Norio Hayafuji, both of Itami; Wataru Susaki, Tokyo, all of Japan

[73] Assignee: Mitsubishi Denki Kabushiki Kaisha, Tokyo, Japan

[21] Appl. No.: 150,884

[22] Filed: Nov. 12, 1993

[30] Foreign Application Priority Data

Nov. 19, 1992 [JP] Japan ................................ 4-335006

[51] Int. Cl.⁶ ............................................. H01S 3/19
[52] U.S. Cl. ......................................... 372/45; 372/46
[58] Field of Search .................................... 372/45, 46

[56] References Cited

U.S. PATENT DOCUMENTS

| | | | |
|---|---|---|---|
| 4,941,146 | 7/1990 | Kobayashi | 372/45 |
| 4,992,837 | 2/1991 | Sakai et al. | 372/45 |
| 5,309,466 | 5/1994 | Ueno et al. | 372/45 |

FOREIGN PATENT DOCUMENTS

| | | |
|---|---|---|
| 55-19789 | 8/1980 | Japan . |
| 3145787 | 6/1991 | Japan . |

OTHER PUBLICATIONS

Itaya et al, "High-Power Operation Of Heterobarrier Blocking Structure InGaAlP Visible Light Laser Diodes", Applied Physics Letters, vol. 56, No. 18, Apr. 1990, pp. 1718-1719.

Primary Examiner—Georgia Y. Epps
Attorney, Agent, or Firm—Leydig, Voit & Mayer

[57] ABSTRACT

A semiconductor laser for producing visible light includes a first conductivity type semiconductor substrate; a first conductivity type semiconductor first cladding layer, a semiconductor active layer of $GaAs_{1-y}P_y$ ($y \leq 0.45$), and a second conductivity type second cladding layer, the first cladding layer, the active layer, and the second cladding layer being successively disposed on the semiconductor substrate, the first and second cladding layers having substantially the same composition and a different composition from the active layer, thereby forming heterojunctions with the active layer, and having a lattice constant different from the lattice constant of the active layer and introducing stress into the active layer without producing dislocations in the active layer; and first and second electrodes electrically connected to the substrate and the second cladding layer, respectively.

12 Claims, 4 Drawing Sheets

SEMICONDUCTOR LASER PRODUCING VISIBLE LIGHT

FIELD OF THE INVENTION

The present invention relates to a semiconductor laser that produces visible light with reduced threshold current density and particularly to a semiconductor laser with an active layer of $GaAs_{1-y}P_y$ ($0.4 \leq y \leq 0.45$).

BACKGROUND OF THE INVENTION

Semiconductor lasers producing visible light have been known for some time. Generally, those lasers employ materials from the InGaAlP system of materials in the various layers within the laser. Typically, the active layer of these lasers is $In_{0.5}Ga_{0.5}P$. That material and all active layer materials in semiconductor lasers must have a "direct" transition energy band structure. In these kinds of materials, as illustrated in FIG. 2(a), the distribution of energy states in the conduction band 24 has a minimum 25 that is directly opposite a maximum 26 of the energy state distribution in the valence band 27 when charge carrier energy is plotted as a function of wave vector. In this type of direct transition energy band structure, electrons and holes can directly recombine to radiate light efficiently without interaction with a phonon. In an indirect transition semiconductor material, i.e., when the energy density minimum and maximum are not directly opposite each other in the wave vector graph, the recombination of an electron and a hole requires a phonon interaction. Light emission is not efficient in direct transition semiconductor materials and laser oscillation has not been achieved in them.

Although the minimum conduction band energy and the maximum valence band energy in a direct transition semiconductor material determine the energy band gap and the wavelength of radiated light when that material is used as the active layer in a semiconductor laser, the conduction band edge structure of binary, ternary, and quaternary III-V compound semiconductor materials is more complex than a single minimum of energy state densities. For example, as shown in FIG. 2(a), the conduction band edge 24 may include a second "valley" 28 displaced from the minimum 25. When the density of electrons sufficiently fills the energy states at the minimum conduction band edge energy 25, some of the carriers may overflow and begin to fill the lowest energy states in the nearby conduction band edge valley 28. Those overflowing electrons cannot participate in laser oscillation because they require phonon interactions in recombining with holes in the valence band. Therefore, current supplied to a semiconductor laser that results in filling of the valley 28 near the conduction band edge minimum energy 25 does not result in laser oscillation and reduces the efficiency of the conversion of electrical current to laser light. One of the external effects of that reduced efficiency is an apparent increase in the threshold current density at which laser oscillation begins.

An example of the structures of a known semiconductor laser 300 producing visible light and employing materials of the InGaAilP material system is illustrated in FIG. 1. That semiconductor laser is described in *Applied Physics Letters*, Volume 56, Number 18, pages 1718-1719, (1990). Referring to FIG. 1, the laser 300 includes an n-type GaAs substrate 11, a one micron thick silicon doped n-type $In_{0.5}(Ga_{0.3}Al_{0.7})_{0.5}P$ first cladding layer 12, a forty nanometer thick undoped $In_{0.5}Ga_{0.5}P$ active layer 13, and a one micron thick zinc doped p-type $In_{0.5}(Ga_{0.3}Al_{0.7})_{0.5}P$ second cladding layer 14. Those three layers are sequentially disposed on the substrate 11 and the second cladding layer 14 includes a central mesa 19. A fifty nanometer thick zinc doped p-type $In_{0.5}Ga_{0.5}P$ cap layer 15 is disposed on the top surface of the mesa of the second cladding layer 14. As well understood in the art, in manufacturing the semiconductor laser 300, the second cladding layer 14 and the cap layer 15 are sequentially grown and the mesa is formed by masking parts of those layers and removing the unmasked parts of the layers by etching. A zinc doped p-type GaAs contact layer 16 is disposed on and contacts the second cladding layer 14 and the cap layer 15. The thickest part of the contact layer 16 is three microns thick. The semiconductor laser 300 also includes electrodes 17 and 18 on the contact layer 16 and the substrate 11, respectively.

As in conventional semiconductor lasers, when the semiconductor laser 300 is forward biased, holes move from the contact layer 16 toward the active layer 13 and electrons move from the substrate 11 toward the active layer 13. The holes and electrons are injected into the active layer 13 where they recombine to produce light. Because the material of the first and second cladding layers is different from the material of the active layer, heterojunctions are formed at the interfaces of the active layer 13 with the first and second cladding layers 12 and 14. The heterojunctions include potential barriers that assist in confining the charge carriers injected into the active layer 13 to an active region to stimulate recombination and the emission of light. Because of the differences in the composition of the first and second cladding layers and the active layer, those layers have different refractive indices. The first refractive index of the first and second cladding layers also assists in confining light produced by carrier recombination to the active layer, defining a resonant cavity for supporting laser oscillation.

In this structure, because of the composition of the active layer 13, the laser light produced has a wavelength of about six hundred seventy nanometers. The light produced by the charge carrier recombinations and confined to the active region resonates between opposed facets 20 and 21 of the laser that are transverse to the mesa 19, resulting in laser oscillation. Most of that laser light is produced along the direction of the mesa 19 because the holes preferentially flow through the mesa toward the active layer 13. In the semiconductor laser 300, since all the materials are selected from the InGaAiP system, partially to ensure relatively close matching between the lattice constants of the different materials, the maximum difference between the energy band gap of the cladding layers and of the active layer is about 0.2 eV.

Although the InGaAlP system of materials offers the advantage of small lattice constant mismatches between various materials within that system, simplifying epitaxial growth processes, a limited amount of strain produced by lattice mismatching between contiguous layers of a semiconductor laser can have a beneficial effect, as illustrated in FIGS. 2(a) and 2(b). As already described, the typical energy state distribution as a function of wave vector for a compound semiconductor material is illustrated in FIG. 2(a). In FIG. 2(a), the energy band edges are illustrated without the presence of any stress, for example, introduced by confining the semiconductor material as a layer between two other layers having different lattice constants. That stress produces a strain, locally altering the lattice constant of the semiconductor layer as compared to the unstressed lattice constant. In FIG. 2(b), the same energy band structure for the same material as in FIG. 2(a) is shown when that material is subjected to a moderate stress. By comparing FIGS. 2(a) and 2(b), it can be seen that the stress causes the valence band edge 27 to become more parabolic, i.e., the density of energy states becomes more closely concentrated around the y axis, the wave vector value at which direct transitions of combining holes and electrons occur. As a result of this change in the distribution of the energy states, laser oscillation efficiency is improved and the threshold current is reduced.

In the InGaAlP material system, it may be desired to introduce stress to achieve improved efficiency, applying the principle illustrated in FIGS. 2(a) and 2(b). For example, the cladding layers might be AlGaP, the material within that system of materials having the largest energy band gap. Theoretically, that material would provide improved charge carrier confinement in the active layer because of increased potential barriers at the heterojunctions with the active layer as well as introducing stress because of the different lattice constants of AlGaP and of the $In_{0.5}Ga_{0.5}P$ active layer. However, because the difference in the lattice constants of AlGaP and $In_{0.5}Ga_{0.5}P$ is so large, the resulting stress can produce crystalline dislocations within the active layer. Dislocations can be avoided for a particular stress by making the active layer sufficiently thin. For example, when the active layer is less than ten nanometers thick, a relatively large amount of stress can be tolerated without the appearance of dislocations. However, such a thin active layer causes rapid filling of the energy states at the minimum of the conduction band with electrons so that electrons easily overflow into an adjacent valley of the conduction band edge. Thus, the improved efficiency achieved by introducing stress is lost. Therefore, suitable materials cannot be selected from the InGaAlP system for constructing a semiconductor laser producing visible light with improved efficiency. The desirable effects of stress on the active layer require that the active layer be so thin that other losses, reducing efficiency, would be experienced.

SUMMARY OF THE INVENTION

It is an object of the present invention to provide a semiconductor laser producing visible light that effectively confines charge carriers in the active layer and restricts the energy distribution of holes, resulting in laser oscillation at a reduced threshold current density.

According to one aspect of the invention, a semiconductor laser for producing visible light comprises a first conductivity type semiconductor substrate; a first conductivity type semiconductor first cladding layer, a semiconductor active layer of $GaAs_{1-y}P_y$ ($y \leq 0.45$), and a second conductivity type second cladding layer, the first cladding layer, the active layer, and the second cladding layer being successively disposed on the semiconductor substrate, the first and second cladding layers having substantially the same composition and a different composition from the active layer, thereby forming heterojunctions with the active layer, and having a lattice constant different from the lattice constant of the active layer and introducing stress into the active layer without producing dislocations in the active layer; and first and second electrodes electrically connected to the substrate and the second cladding layer, respectively.

According to a second aspect of the invention, a semiconductor laser for producing visible light comprises a first conductivity type semiconductor substrate; a first conductivity type semiconductor first cladding layer, a semiconductor active layer including alternating layers of $GaAs_{1-y}P_y$ ($y \leq 0.45$) and GaP, and a second conductivity type second cladding layer, the first cladding layer, the active layer, and the second cladding layer being successively disposed on the semiconductor substrate, the first and second cladding layers having substantially the same composition, forming heterojunctions with the active layer and introducing stress into the active layer without producing dislocations in the active layer; and first and second electrodes electrically connected to the substrate and the second cladding layer, respectively.

Other objects and advantages of the present invention will become apparent from the detailed description given hereinafter. The detailed description of specific embodiments is for illustration only since various additions and modifications of the embodiments within the spirit and scope of the invention will become apparent to those of skill in the art from the detailed description.

BRIEF DESCRIPTION OF THE DRAWING FIGURES

FIG. 1 is a perspective, schematic view of a prior art semiconductor laser producing visible light.

FIGS. 2(a) and 2(b) are energy band diagrams illustrating the effect of strain on the distribution of energy states in the valence band of a compound semiconductor material.

DETAILED DESCRIPTION OF PREFERRED EMBODIMENTS

Figure 3:
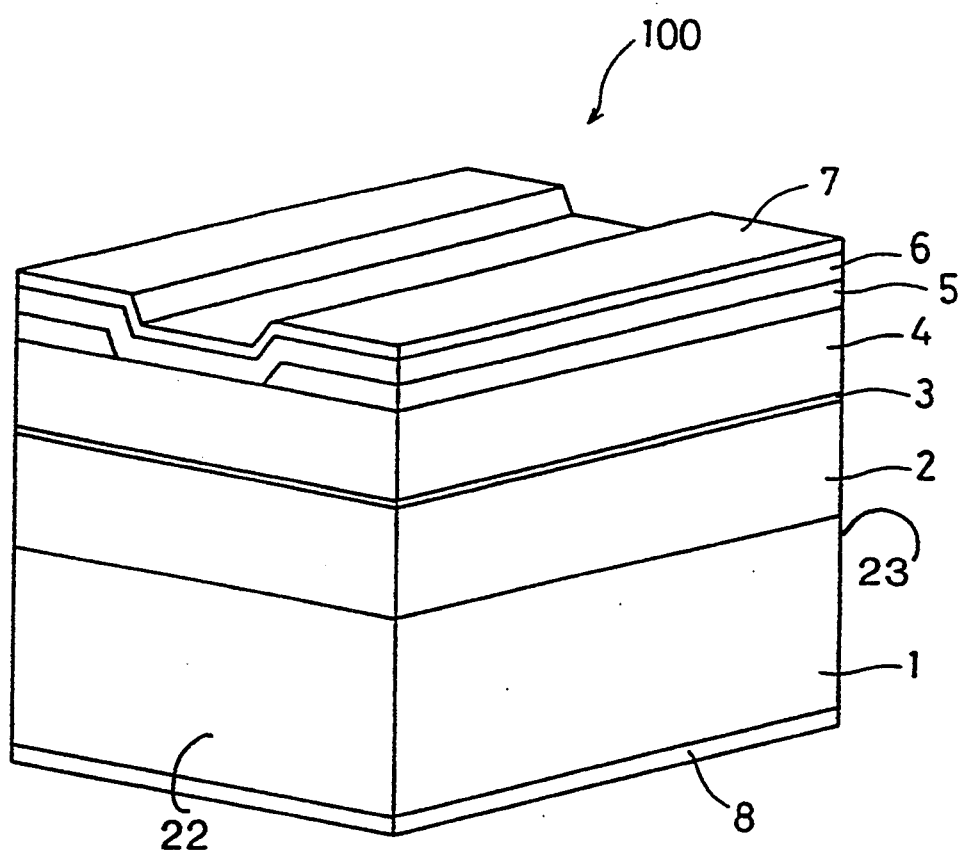
FIG. 3 is a perspective, schematic view of a semiconductor laser producing visible light according to an embodiment of the invention.

FIG. 3 is perspective, schematic view of a semiconductor laser 100 for producing visible light according to an embodiment of the invention. The semiconductor laser 100 includes an n-type GaP substrate 1 on which there are successively disposed a one micron thick n-type $Al_{0.3}Ga_{0.7}P$ first cladding layer 2, a twenty nanometer thick undoped $GaAs_{0.55}P_{0.45}$ active layer 3, and a 0.7 micron thick p-type $Al_{0.3}Ga_{0.7}P$ second cladding layer 4. The semiconductor laser 100 has a groove-type structure. A 0.2 micron thick n-type $Al_{0.7}Ga_{0.3}P$ current blocking layer 5 is disposed on the second cladding layer 4 and has a central longitudinal groove exposing part of the second cladding layer 4. The groove is formed conventionally during the manufacture of the laser 100 by masking and etching the current blocking layer 5, for example, with an etchant including $H_2SO_4$, $H_2O_2$, and water mixed in a ratio of 5:1:1. A 0.2 micron thick p-type GaP cap layer 6 is disposed on the current blocking layer 5 and on the second cladding layer 4 in the groove in the current blocking layer 5. Electrodes 7 and 8 are disposed on and are in electrical contact with the cap layer 6 and the substrate 1, respectively. The semiconductor laser 100 includes front and rear facets 22 and 23 transverse to the layers 2, 3, and 4 forming a resonator including the double heterojunction structure of layers 2, 3, and 4. In addition, the groove in the current blocking layer 5 aids in concentrating the current flow between the electrodes 7 and 8 into an active region of the active layer 3, assisting in defining the resonant cavity of the laser 100.

The semiconductor laser 100 is manufactured using conventional techniques including the successive epitaxial growth of the compound semiconductor layers 2-6 on the substrate 1 by metal organic chemical vapor deposition or molecular beam epitaxy. The electrodes 7 and 8 may be formed by depositing an alloy of gold and germanium followed by the deposition of gold. The facets 22 and 23 are preferably formed by cleaving.

Figure 2:
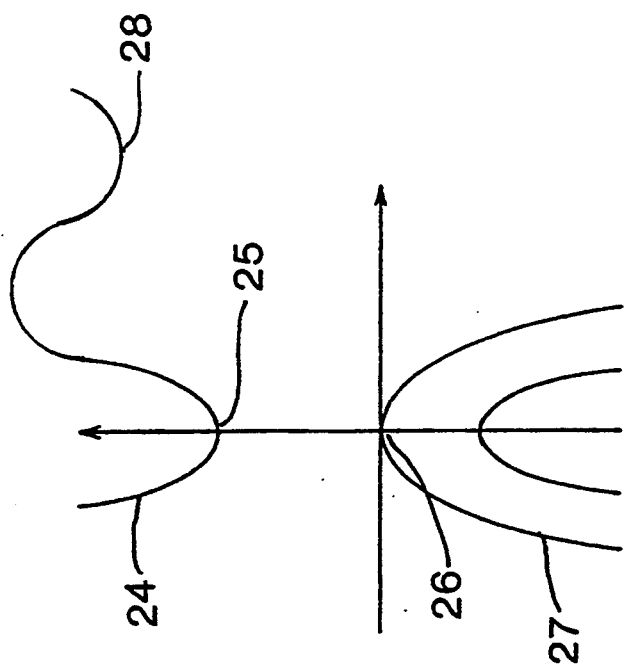
Figure 2:
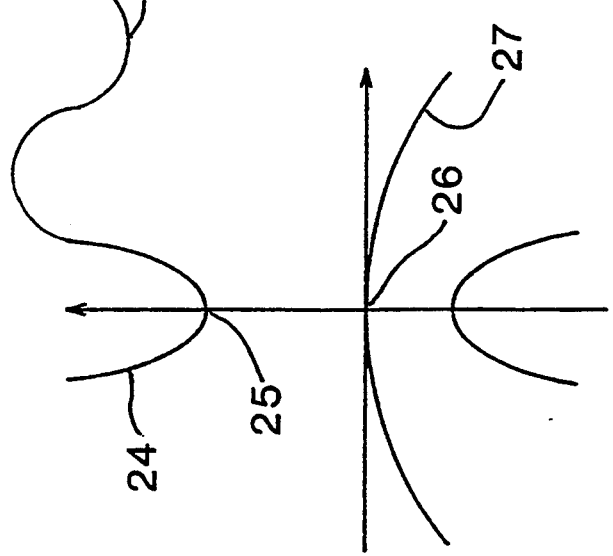

$GaAl_{1-y}P_y$ has a direct transition energy band structure provided y is no larger than 0.45. Therefore, in order to produce laser oscillation, y cannot exceed 0.45. With that composition of the active layer 3 and $Al_{0.3}Ga_{0.7}P$ cladding layers 2 and 4, the lattice constant mismatch between the active layer 3 and the cladding layers 2 and 4 is about two percent. That mismatch is sufficient to introduce stress and alter the distribution of the density of states in the valence band of the active layer 3, as illustrated in FIGS. 2(a) and 2(b), thereby improving the electricity-to-light conversion efficiency of the laser. When, as in the specific example described, the active layer 3 is twenty nanometers thick, the stress does not produce dislocations in the active layer 3 that adversely affect laser performance. When y is decreased below 0.45, the lattice constant mismatch and the introduced stress increase, increasing the risk of generating dislocations in the active layer. Therefore, as y is decreased, the thickness of the active layer 3 is decreased to avoid the generation of dislocations. As a practical limitation, once the thickness of the active layer 3 is reduced to about ten nanometers, the improved efficiency achieved through the introduction of stress into the active layer declines because of charge carrier overflow. Therefore, when the thickness of the active layer 3 is reduced to about ten nanometers, i.e., when y equals about 0.4, to control the stress introduced by lattice constant mismatching so that dislocations are not generated, a practical limit is reached.

In the semiconductor laser 100 described above, the energy band gap of the first and second cladding layers 2 and 4 ranges from 2.26 to 2.46 eV and the energy band gap of the active layer 3 is about 2.15 eV. The energy band gap difference between the cladding and active layers ranges from 0.1 to 0.3 eV, providing relatively large charge carrier confining potential barriers at the heterojunctions. The refractive indices of the second and first cladding layers 2 and 4 fall within a range from about 3.03 to 3.45, efficiently confining light in the active layer 3.

The operation of the semiconductor laser 100 is similar to that of the operation of the prior art semiconductor laser 300. In response to a forward bias, resulting in the flow of a current exceeding the threshold current density of the laser, holes move from the cap layer 6 in the direction of the active layer 3 and electrons move from the substrate 1 toward the active layer 3. The holes and electrons are injected into that active layer 3 and are confined in that layer by the potential barriers at the heterojunctions of the first and second cladding layers 2 and 4 and the active layer 3. The injected, confined charge carriers recombine to produce red light having a wavelength of about six hundred fifty nanometers when the active layer has a composition of $GaAs_{0.55}P_{0.45}$. The differences in refractive indices of the cladding layers and the active layer confine the light generated by charge carrier recombination to the portion of the active layer opposite the groove, causing the light to resonate between the facets 22 and 23 of the resonator structure, producing laser oscillation.

Figure 4A:
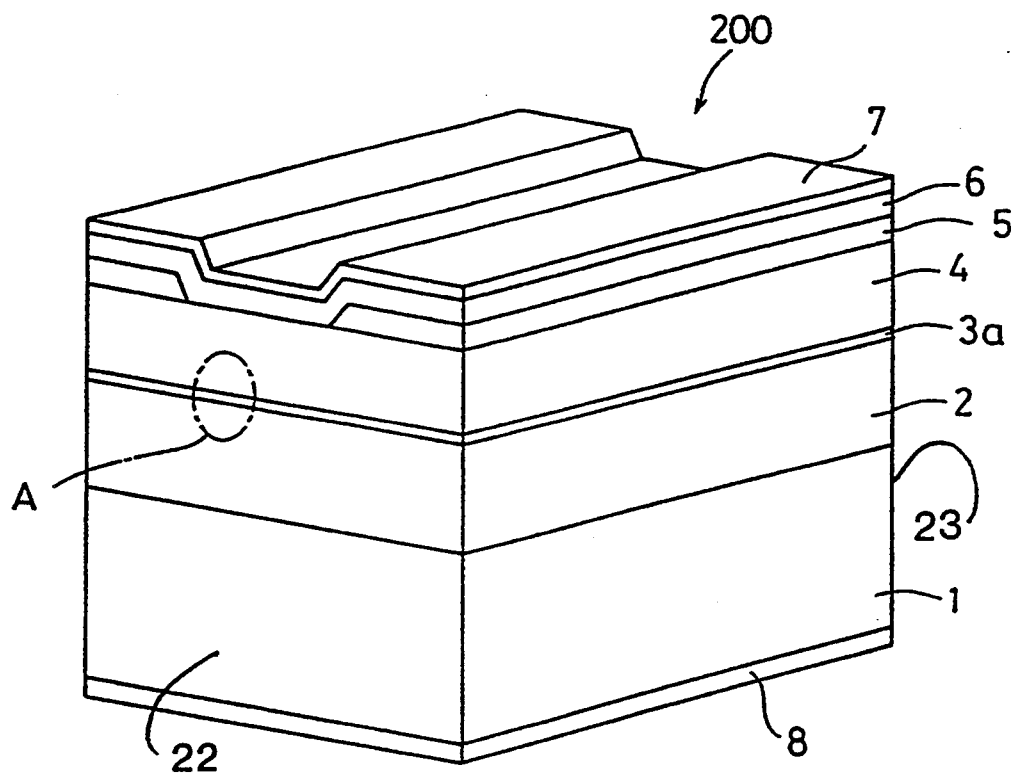
FIG. 4(a) is a perspective, schematic view of a semiconductor laser producing visible light according to an embodiment of the invention.
Figure 4B:
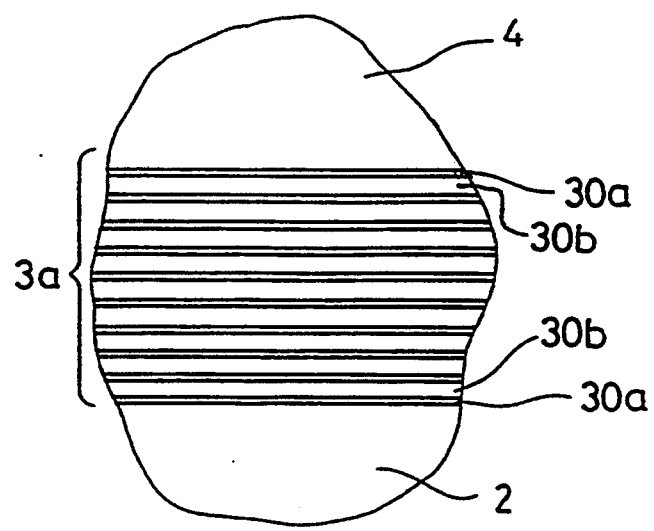
FIG. 4(b) is an enlarged, detail view of a part of the semiconductor laser structure of FIG. 4(a).

FIG. 4(a) is a schematic, perspective view of a semiconductor laser 200 producing visible light in accordance with another embodiment of the invention. The structure of the semiconductor laser 200 is identical to that of the structure of the semiconductor laser 100 with the exception of the active layer 3a which, in the semiconductor laser 200, comprises a multi-quantum well structure. As illustrated more clearly in FIG. 4(b), that active layer 3a includes ten or more alternating layers 30a and 30b of different materials. The alternating layers 30a, for example, are undoped five nanometer thick layers of $GaAs_{0.55}P_{0.45}$ and the alternating layers 30b are twenty nanometer thick layers of GaP. The undoped GaP layers 30b have a much higher energy band gap than the $GaAs_{1-y}P_y$ layers 30a. Most preferably, the layers of the active layer 3a that are adjacent and in contact with the first and second cladding layers 2 and 4 are the narrower energy band gap $GaAs_{1-y}P_y$ layers 30a. The multi-quantum well active layer 3a functions in the same way as the active layer 3 of the semiconductor laser 100.

In the semiconductor laser 200, the total thickness of the layers 30a and 30b, i.e., of the active layer 3a, if at least ten of each of those layers is present, is larger than the thickness of the active layer 3 of the semiconductor laser 100. Nevertheless, stress is desirably present, altering the effective valence band edge structure of the multi-quantum well structure. Because of the alternating layer structure, dislocations are not introduced in the thicker active layer 3a even though stress is present so that the desirable effects of stress are achieved without overflow of charge carriers from the relatively thick active layer. All of these characteristics result in improved light emission efficiency.

Although the semiconductor lasers 100 and 200 were described as including a substrate 1 of GaP, because its lattice constant is nearly the same as that of silicon, a less expensive substrate of silicon may be employed in place of the GaP substrate. When a silicon substrate is used, it may extend beyond the semiconductor laser structure, enabling the production of other semiconductor devices, such as memory elements or transistors, in the substrate that may be associated with the semiconductor laser.

Figure 1:
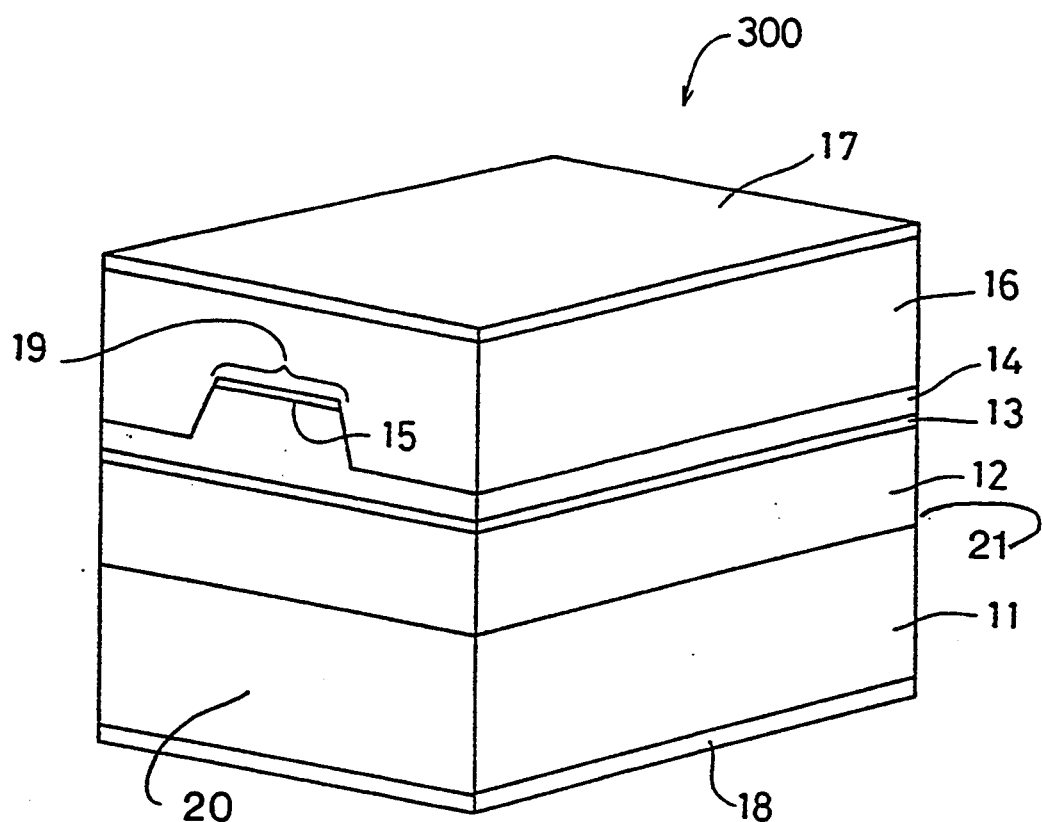

While the specific embodiments of the invention illustrated in the figures employ a groove-type semiconductor laser structure, the invention is not limited to that particular semiconductor laser structure. A mesa structure of the type illustrated in FIG. 1 may also be employed in the invention with an active layer of $GaAs_{1-y}P_y$ and $Al_xGa_{1-x}P$ cladding layers, provided the active layer is a direct transition semiconductor material and that the stress introduced into the active layer by the first and second cladding layers is not sufficient, considering the thickness of the active layer, to produce dislocations in the active layer.

We claim:

1. A semiconductor laser for producing visible light comprising:

a first conductivity type semiconductor substrate;

a first conductivity type semiconductor first cladding layer, a semiconductor active layer of GaAs$_{1-y}$P$_y$ (y≦0.45), and a second conductivity type second cladding layer, the first cladding layer, the active layer, and the second cladding layer being successively disposed on the semiconductor substrate, the first and second cladding layers having substantially the same composition and a different composition from the active layer, thereby forming heterojunctions with the active layer, and having a lattice constant different from the lattice constant of the active layer and introducing stress into the active layer without producing dislocations in the active layer;

first and second opposed facets transverse to the first cladding, active, and second cladding layers defining, witch the heterojunctions, an optical resonator; and first and second electrodes electrically connected to the substrate and the second cladding layer, respectively.

2. The semiconductor laser of claim 1 including a first conductivity type semiconductor current blocking layer disposed on the second cladding layer and including a groove exposing part of the second cladding layer and a second conductivity type cap layer disposed on the current blocking layer and on the second cladding layer in the groove, the second electrode being disposed on and in direct contact with the cap layer.

3. The semiconductor laser of claim 1 wherein y≧0.4, the first and second cladding layers are Al$_x$Ga$_{1-x}$P (0≦x≦1), and the thickness of the active layer ranges from ten to twenty nanometers.

4. The semiconductor laser of claim 3 wherein x is approximately equal to 0.3.

5. The semiconductor laser of claim 1 wherein the substrate is selected from the group consisting of silicon and GaP.

6. A semiconductor laser for producing visible light comprising:

a first conductivity type semiconductor substrate;

a first conductivity type semiconductor first cladding layer, a semiconductor active layer including alternating layers of GaAs$_{1-y}$P$_y$ (y≦0.45) and GaP, and a second conductivity type second cladding layer, the first cladding layer, the active layer, and the second cladding layer being successively disposed on the semiconductor substrate, the first and second cladding layers having substantially the same composition, forming heterojunctions with the active layer and introducing stress into the active layer without producing dislocations in the active layer;

first and second opposed facets transverse to the first cladding active, and second cladding layers defining, with the heterojunctions, an optical resonator; and first and second electrodes electrically connected to the substrate and the second cladding layer, respectively.

7. The semiconductor laser of claim 6 including a first conductivity type semiconductor current blocking layer disposed on the second cladding layer and including a groove exposing part of the second cladding layer and a second conductivity type cap layer disposed on the current blocking layer and on the second cladding layer in the groove, the second electrode being disposed on and in direct contact with the cap layer.

8. The semiconductor laser of claim 6 wherein y≧0.4, the first and second cladding layers are Al$_x$Ga$_{1-x}$P.

9. The semiconductor laser of claim 8 wherein x is approximately equal to 0.3.

10. The semiconductor laser of claim 6 wherein each GaAs$_{1-y}$P$_y$ layer in the active layer is about five nanometers thick and each GaP layer in the active layer is about twenty nanometers thick.

11. The semiconductor laser of claim 10 wherein the active layer includes at least ten layers of GaAs$_{1-y}$P$_y$ and at least ten layers of GaP.

12. The semiconductor laser of claim 6 wherein the substrate is selected from the group consisting of silicon and GaP.

* * * * *

UNITED STATES PATENT AND TRADEMARK OFFICE
CERTIFICATE OF CORRECTION

PATENT NO. : 5,394,417
DATED : February 28, 1995
INVENTOR(S) : Takemi et al.

It is certified that error appears in the above-indentified patent and that said Letters Patent is hereby corrected as shown below:

Column 7, Line 5, change "$GaAs_{1-yPy}$" to --$GaAs_{1-y}P_y$--.

Signed and Sealed this

Sixth Day of June, 1995

*Attest:*

BRUCE LEHMAN

*Attesting Officer*      *Commissioner of Patents and Trademarks*